(12) United States Patent
Kikuchi

(10) Patent No.: US 7,345,322 B2
(45) Date of Patent: Mar. 18, 2008

(54) LIGHT EMITTING DIODE

(75) Inventor: Satoru Kikuchi, Akiruno (JP)

(73) Assignee: Citizen Electronics Co., Ltd., Yamanashi (JP)

(*) Notice: Subject to any disclaimer, the term of this patent is extended or adjusted under 35 U.S.C. 154(b) by 85 days.

(21) Appl. No.: 11/344,603

(22) Filed: Feb. 1, 2006

(65) Prior Publication Data

US 2006/0169991 A1 Aug. 3, 2006

(30) Foreign Application Priority Data

Feb. 1, 2005 (JP) ............... 2005-025682

(51) Int. Cl.
*H01L 31/0203* (2006.01)
(52) U.S. Cl. .......... 257/99; 257/E33.056; 257/E33.058
(58) Field of Classification Search .......... 257/99, 257/100, E33.056–E33.058, E33.066, 785; 313/501, 500, 499, 498; 438/117
See application file for complete search history.

(56) References Cited

U.S. PATENT DOCUMENTS 6,984,852 B2 * 1/2006 Wang et al. ............... 257/99
2003/0214028 A1 * 11/2003 Brechignac et al. ........ 257/706
2005/0067687 A1 * 3/2005 Canella .................... 257/698

FOREIGN PATENT DOCUMENTS

JP 2001-007405 A 1/2001
JP 2004-317891 A 11/2004

* cited by examiner

*Primary Examiner*—Matthew C. Landau
*Assistant Examiner*—Minchul Yang
(74) *Attorney, Agent, or Firm*—Browdy and Neimark, PLLC

(57) ABSTRACT

An LED including a substrate having a pair of terminal electrodes, at least one LED element mounted on the substrate, a frame disposed on the substrate, holes provided in the substrate, concave portions provided in positions of the frame facing the holes, and a pair of conductive elastic members provided between the frame and the substrate, each of the conductive elastic members including a large diameter portion inserted in the corresponding concave portion and a small diameter portion inserted in the corresponding hole and electrically connected to the large diameter portion, the large diameter portions of the pair of conductive elastic members being electrically connected to the pair of terminal electrodes, respectively, and each of the large diameter portions having one end portion which is in contact with a bottom surface of the concave portion and each of the small diameter portions having one end portion which is disposed to project from the hole of the substrate.

13 Claims, 11 Drawing Sheets

LIGHT EMITTING DIODE

CROSS-REFERENCE TO THE RELATED APPLICATION

This application is based on and claims the priority benefit of Japanese Patent Application No. 2005-25682 filed on Feb. 1, 2005, the contents of which are incorporated herein by reference in their entirety.

BACKGROUND OF THE INVENTION

1. Field of the Invention

The present invention relates to a wavelength-conversion type light emitting diode (LED), more specifically to a white LED used to illuminate a subject when photographing the subject with a camera which is installed in an electronics device such as a mobile phone.

2. Description of Related Art

Recently, there has been an accelerated multifunctionization of mobile electronics devices such as mobile phones; in particular, mobile phones in which digital cameras are installed have become widely used. Furthermore, mobile phones including an electric flash structure for outputting flash light for photography have been proposed (see, for reference, Japanese Patent Laid-Open 2004-317891, page 3, FIG. 12). Here, refer to FIG. 19, the electric flash structure of a conventional mobile phone includes an electric flash emission part 105 which has a printed substrate 107, a white LED 111 mounted on the printed subsrate 107 and emitting white light, an electric flash emission lens 112, and a light shielding holder 113 for holding the electric flash emission lens 112 in position to engage an upper case 103 of the mobile phone and guides light emitted from the white LED 111 to the electric flash emission lens 112 without leakage.

The white LED 111 acts as a light source of the electric flash emission part 105, and a surface mount type LED for converting blue light into white light is, for example, used (see, for reference, Japanese patent Laid-Open 2001-7405, pages 3 and 4, FIG. 2).

FIG. 20 illustrates one example of a white LED used in the above-mentioned electric flash device. The white LED 11 shown in FIG. 20 includes a rectangular glass epoxy substrate 12, a pair of electrodes (cathode electrode 13 and anode electrode 14) patterned on the glass epoxy substrate 12, an LED element 20 mounted on a central portion of an upper surface of the glass epoxy substrate 12, a fluorescent material-containing layer 21 applied on a back surface of the LED element 20, bonding wires 27 and 28 for connecting the LED element 20 and the pair of electrodes 13, 14, respectively, and a cuboid-shaped translucent sealing resin 19 for sealing an upper portion of the LED element 20.

The white LED 11 is heated at about 240° C. in a reflow device using an infrared radiation and heated air system and surface mounted on a mother board by fixing lower surfaces of the pair of electrodes 13 and 14 to printed wirings 16 and 17 formed on the mother board 15 through solder 18.

Meanwhile, the fluorescent material-containing layer 21 applied to the back surface of the LED element 20 includes an adhesive base with an appropriate amount of fluorescent material which is uniformly dispersed in the adhesive. The back surface of the LED element 20 is fixed to the upper surface of the glass epoxy substrate 12 by a heat-hardening adhesive. The fluorescent material is excited by light emitted from the LED element 20, thus converting short-wavelength visible light into long-wavelength visible light.

For example, an yttrium compound or the like may be used as the fluorescent material.

Moreover, if the LED element 20 is a blue LED element including, for example, a gallium nitride based compound semiconductor, blue light is emitted from the blue LED element upwardly, downwardly and laterally. In this case, a portion of the blue light directed in a downward direction hits and excites the fluorescent material dispersed in the fluorescent material-containing layer 21, and is converted in wavelength into yellow light. The yellow light is emitted in all directions. The emitted yellow light is mixed with blue light 31 directed from the LED element 20 upwardly and laterally so that white light can be emitted.

However, a size of the above-mentioned surface mount type LED is limited by the design of a belonging electronics device, in particular, the thickness, of a case of an electronics device in which the LED is mounted. Therefore, LEDs installed in electronics devices are produced in various sizes according to designs, and also it is required to prepare additional parts such as spacers for fine adjustment. Accordingly, there is a problem that this results in troublesome work and very high cost.

In addition, because a process in which an LED is heated in the reflow device and mounted on a mother board of an electronics device by soldering is required for a surface mount type LED, there is a problem that the LED element itself and other parts used for the LED need to be heat resistant.

Furthermore, when the LED passes through the reflow process, there is a problem that separation of the substrate and the translucent sealing resin at the surface boundary thereof and disconnection of the bonding wires occur easily, thereby reducing reliability, stability, and so on.

SUMMARY OF THE INVENTION

An object of the present invention is to provide an LED capable of easy and inexpensive mounting by a simple structure and flexible to design changes, in particular, thickness, of a case of an electronics device such as a mobile phone using LED, when the LED is used as an electric flash light source used in the electronics device.

When the LED is used as an electric flash device in an electronics device including functions of camera and movie, a light emitting part of the electric flash device needs to be disposed adjacent to an exterior of a case belonging to the electronics device. Even if a thickness of the case changes, the LED according to the present invention can accommodate the changes by changing length of conductive elastic members of the LED.

Another object of the present invention is to provide an LED which prevents separation of a substrate and a translucent sealing resin at a surface boundary thereof by eliminating a reflow process, and having high reliability and stability for a long period.

To accomplish the above-mentioned objects, an LED according to one embodiment of the present invention includes a substrate provided with a pair of terminal electrodes, an LED element mounted on the substrate, a translucent sealing resin to cover the LED element, and a frame disposed on the substrate.

The LED further includes holes penetrating the substrate and each of the holes is provided adjacent to each of the terminal electrodes, and concave portions provided in positions of the frame facing the holes of the substrate, and a pair of conductive elastic members provided respectively in the concave portions and holes.

Each of the conductive elastic members has a large diameter portion and a small diameter portion. The large diameter portion is disposed in the corresponding concave portion and the small diameter portion is inserted in the corresponding hole, and the small diameter portion is electrically connected to the large diameter portion.

Each large diameter portion has a portion electrically connected to each of the pair of terminal electrodes, and each small diameter portion is disposed in each hole and projected from each hole at the bottom surface of the substrate.

DETAILED DESCRIPTION OF THE PREFERRED EMBODIMENTS preferred embodiments of the present invention will be explained below in detail with reference to the accompanying drawings.

A first embodiment of an LED according to the present invention is shown in FIGS. 1 to 5.

Figure 1:
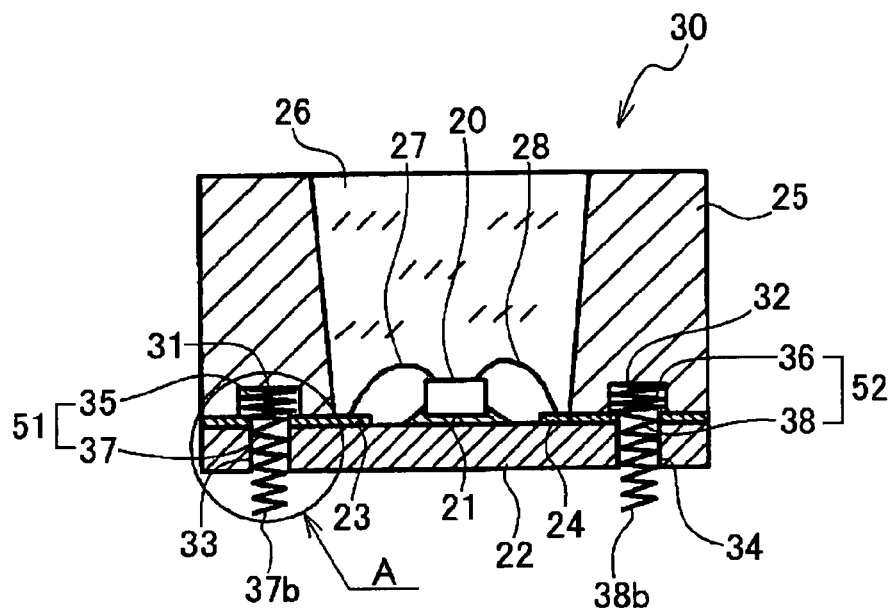
FIG. 1 is a schematic sectional view showing a first embodiment of an LED according to the present invention.

The LED 30 in the first embodiment includes a substrate 22 and a pair of terminal electrodes provided on the substrate 22, as shown in FIG. 1. The substrate 22 is made of a rectangular glass epoxy resin and has an upper surface and a lower surface. In a case that a plurality of LEDs are manufactured in an aggregation, the substrate is preferably square-shaped. The terminal electrodes are patterned on the upper surface of the substrate 22 and include a cathode electrode 23 and an anode electrode 24.

The cathode and anode electrodes 23 and 24 are made of gold, silver, or copper to which aluminum plating is applied, or the like.

At least one LED element 20 is mounted on and fixed to a central portion of the upper surface of the substrate 22 through a fluorescent material-containing layer 21. Of course, the fluorescent material and a dye may be contained in a translucent sealing resin and the number of LED elements provided in an LED may change according to need. The LED element 20 here is a blue light emitting element made of a gallium nitride based compound semiconductor. The LED element 20 is electrically connected to the cathode electrode 23 and the anode electrode 24 which are provided on the substrate 22 through bonding wires 27 and 28. Instead of using the bonding wires, flip chip bonding using bumps (not shown) may be used.

Heat resisting or insulative material is preferable as a material of the substrate 22; for example, in addition to the above-mentioned glass epoxy resin, bismaleimide triazine (BT resin), ceramic, liquid crystal polymer, polybutylene terephthalate resin (BT resin) may be used.

On the other hand, the fluorescent material-containing layer 21 disposed on a back surface of the LED element 20 includes an adhesive base with a fluorescent material which is dispersed in the adhesive. The back surface of the LED element 20 is fixed to the upper surface of the substrate 22 by heating and solidifying the adhesive.

A frame, for example, a reflective frame 25 is disposed on the upper surface of the substrate 22. The reflective frame 25 includes a truncated-cone hole having an inner wall surface which is disposed to surround the LED element on the substrate and reflects light emitted from the LED element 20. The inner wall surface has a taper shape configured to broaden toward an upper end of the reflective frame, whereby allowing the light from the LED element 20 to be focused toward an upward direction.

The truncated-cone hole of the reflective frame 25 is filled with a translucent sealing resin 26 to cover and protect the LED element 20, the bonding wires 27 and 28, and so on. The translucent sealing resin 26, formed from, for example, translucent epoxy resin, transmits the light emitted from the LED element 20 to the outside of the LED efficiently, and protects the LED element 20, bonding wires 27, 28 and so on from any external force, dust or the like. Acrylic resin, polycarbonate resin, polyimide resin or the like, other than the epoxy resin, may be used as a material of the translucent sealing resin 26.

The light emitted from the LED element 20 is emitted from the LED upwardly, downwardly and laterally as blue light. In particular, one portion of the downwardly emitted blue light excites the fluorescent material dispersed in the fluorescent material-containing layer 21 and is wave-converted into yellow light. The yellow light is mixed with the blue light emitted from the LED element 20 to emit white light.

In this embodiment, a pair of holes 33 and 34 are provided in the substrate 22 of the LED 30 and the holes 33, 34 are penetrating the substrate 22, extending from the upper surface to the lower surface. The holes 33 and 34 are preferably disposed adjacent to the cathode and anode electrodes 23 and 24 disposed on the upper surface of the substrate, respectively. On the other hand, a plurality of concave portions, for example, concave portions 31 and 32 are provided in a bottom surface of the reflective frame 25 in contact with the substrate 22 at positions of the reflective frame 25 facing the holes 33 and 34 of the substrate 22.

Here, an inner diameter of each of the holes 33 and 34 is set to be smaller than that of each of the concave portions 31 and 32 provided in the reflective frame 25.

Figure 2:
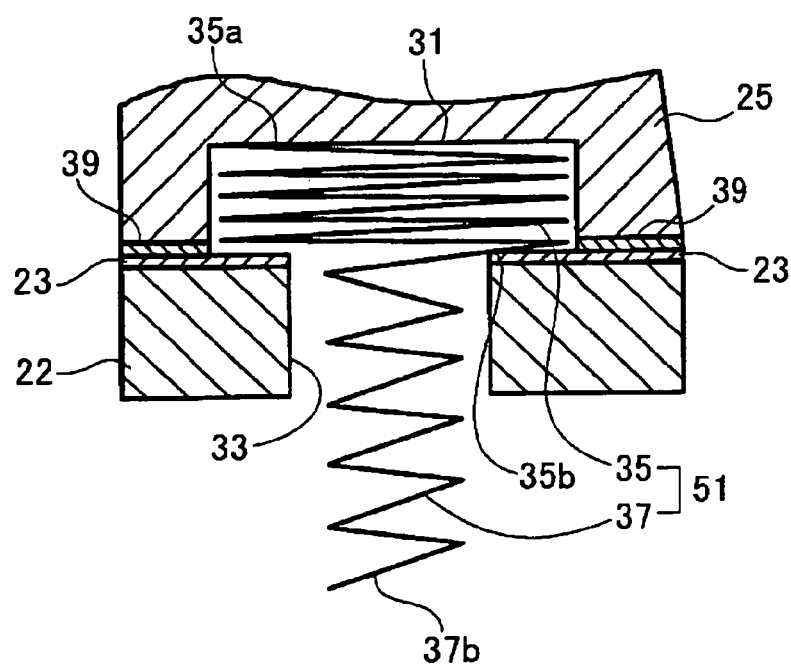
FIG. 2 is an enlarged sectional view of portion A in FIG. 1.
Figure 3:
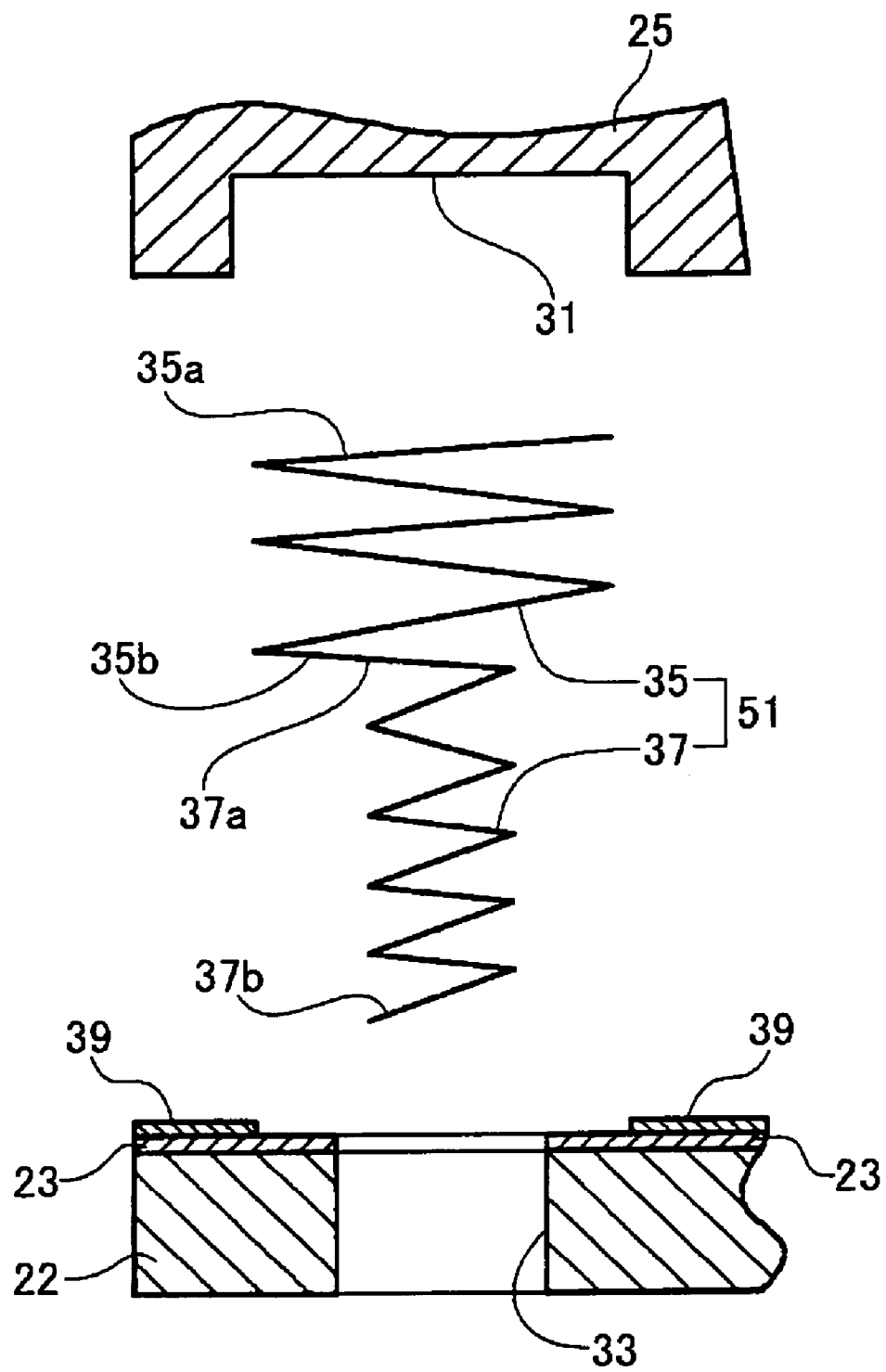
FIG. 3 is an exploded enlarged sectional view of the portion A in FIG. 1.

A pair of conductive elastic members 51 and 52 are disposed in the holes 33 and 34 of the substrate 22, and the concave portions 31 and 32 are disposed in the reflective frame 25, respectively (see FIGS. 1 and 2). The conductive elastic members 51 and 52 include conductive first coil springs 35 and 36 forming a large diameter portion respectively and conductive second coil springs 37 and 38 forming a small diameter portion, respectively, as shown in FIGS. 2 and 3. The first and second coil springs 35, 37, and the first and second coil springs 36, 38 are integrally formed and electrically connected and configured to form two-step spring structures, respectively (see FIG. 3). Each of the first coil springs 35 and 36 forming a large diameter portion which is disposed in a compressed state between a bottom surface of each of the concave portions 31, 32 of the reflective frame 25 and each of the pair of terminal electrodes disposed on the substrate (see FIG. 2).

In addition, each of the second coil springs 37 and 38 forming the small diameter portion is inserted in each of the holes 33 and 34 of the substrate 22, as shown in FIGS. 1 and 2.

More specifically, as shown in FIGS. 2 and 3, the first coil spring 35 is disposed in the concave portion 31 of the reflective frame 25.

The first coil spring 35 has one end 35a which is in contact with a bottom surface of the concave portion 31 and the other end portion 35b which is in contact with the cathode electrode 23 of the substrate 22 and electrically connected thereto.

An outer diameter of the first coil spring 35 is set to be smaller than the inner diameter of the concave portion 31 of the reflective frame 25 and larger than the inner diameter of the hole 33 of the substrate 22.

On the other hand, the second coil spring 37 has one end 37a which is integrally connected with the end 35b of the first coil spring 35 (see FIG. 3). An outer diameter of the second coil spring 37 is set to be smaller than the outer diameter of the first coil spring 35. The second coil spring 37 has another end 37b which is disposed to project from the hole 33 of the substrate 22 to form a connecting terminal to connect to an exterior device (not shown).

In this way, the conductive elastic member 51 in which the first and second coil springs 35 and 37 are integrally formed is configured to form the two-step spring structure having stability of mechanical expansion and contraction.

A process for assembling the above-mentioned conductive elastic member 51 is shown in FIG. 3.

The second coil spring 37 which has the small diameter portion is first inserted in the hole 33 of the substrate 22 from a side where the cathode electrode 23 is disposed, and the end 35b of the first coil spring 35 which is the large diameter portion is then disposed to be in contact with the cathode electrode 23. At this time, the end 37b of the second coil spring 37 is projected from the hole 33 to form the connecting terminal to the exterior device.

Next, the first coil spring 35 which has the large diameter portion is contained in the concave portion 31 of the reflective frame 25, and the one end 35a of the first coil spring 35 is disposed to be in contact with the bottom surface of the concave portion 31. Furthermore, the reflective frame 25 is pressed down toward the substrate 22. When the reflective frame 25 comes into contact with the substrate 22, they are fixed by an adhesive 39. An adhesive sheet may be used instead of the adhesive 39.

As shown in FIG. 2, the first coil spring is compressed and the end 35b makes contact with the cathode electrode 23 disposed on the substrate 22 in the compressed state to be electrically connected.

The first coil spring 36 constituting the other conductive elastic member 52 is disposed in the concave portion 32 of the reflective frame 25, similarly to the first coil spring 35 of the conductive elastic member 51. The first coil spring 36 has one end which is in contact with a bottom surface of the concave portion 32 and the other end portion which is in contact with the anode electrode 24 disposed on the substrate 22 and electrically connected thereto.

An outer diameter of the first coil spring 36 is set to be smaller than the inner diameter of the concave portion 32 of the reflective frame 25 and larger than the inner diameter of the hole 34 of the substrate 22.

Moreover, as shown in FIG. 1, the second coil spring 38 has one end which is integrally connected with one end portion of the first coil spring 36. An outer diameter of the second coil spring 38 is set to be smaller than the outer diameter of the first coil spring 36. The second coil spring 38 has the other end 38b which is disposed to project from the hole 34 at the lower surface of the substrate 22 to form a connecting terminal to connect to an exterior device (not shown).

In this way, the conductive elastic member 52 in which the first and second coil springs 36 and 38 are integrally formed is configured to form the two-step spring structure having stability of mechanical expansion and contraction, similarly to the conductive elastic member 51.

The conductive elastic member 52 is installed together with the above-mentioned conductive elastic member 51 by the process similar to that used for the conductive elastic member 51.

That is to say, the one end of the first coil spring 36 is first inserted in the concave portion 32 of the reflective frame 25 in a state in which the first coil spring is compressed and the other end portion of the first coil spring 36 is disposed to be in contact with the anode electrode 24 of the substrate 22 in a compressed state to be electrically connected.

Because a structure is the same as that for the conductive elastic member 51, a further detailed description is omitted.

Here, in the first embodiment, the terminal electrodes 23 and 24 disposed on the front surface of the substrate 22 are electrically connected to printed wirings on a mother board belonging to an electronics device through the conductive elastic members 51 and 52 which are projecting from the lower surface of the substrate.

This structure will be mentioned hereinafter in detail.

Figure 4:
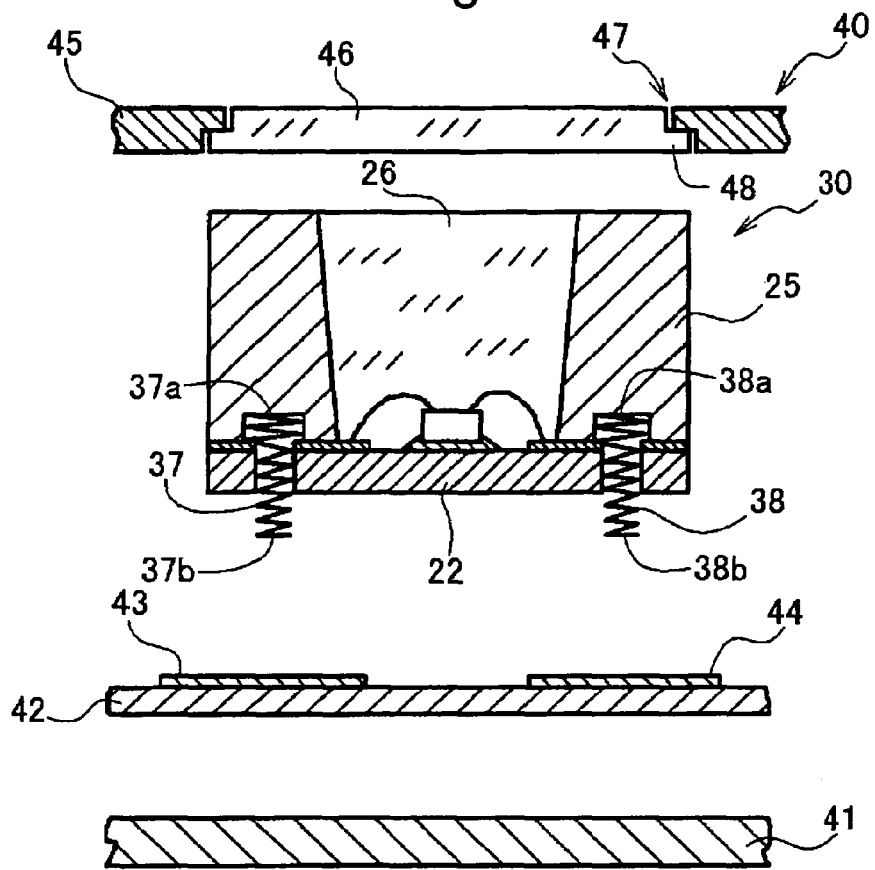
FIG. 4 is an exploded sectional view showing an example in which the LED in the first embodiment is installed as a flash electric light source in a mobile device including functions of camera and movie.
Figure 5:
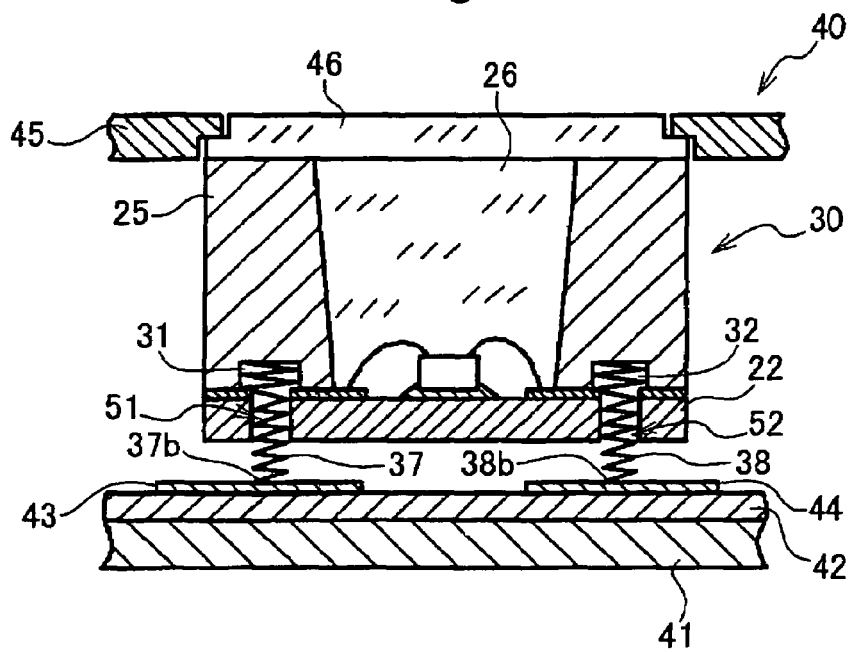
FIG. 5 is a sectional view showing an example in which the LED in the first embodiment is installed in the mobile device.

FIGS. 4 and 5 illustrate an example in which the LED 30 is provided as an electric flash light source of an electric flash part 40 of a mobile phone with functions of camera and movie. The mobile phone includes a mother-board and a case.

As shown in FIGS. 4 and 5, the electric flash part 40 of the mobile phone includes a case (not shown entirely) having an upper plate 45, lower plate 41 and a supplementary cover 46 attached to the upper plate 45. An outer peripheral portion of the supplementary cover 46 is fitted in a concave portion 47 provided in the upper plate 45.

More specifically, the outer peripheral portion of the supplementary cover 46 has a flange 48 which is engaged with an edge of the concave portion 47 of the upper plate 45, thereby the supplementary cover 46 is fixed to the upper plate 45 in a state in which an upper surface of the supplementary cover 46 is exposed from the concave portion 47.

On the other hand, the LED 30 is disposed and utilized inside the mobile phone with functions of camera and movie.

In FIGS. 4 and 5, the LED 30 is installed between the upper and lower plates 45 and 41. More specifically, an upper surface of the reflective frame 25 which is positioned at an emission side of the LED 30 is disposed to be in contact with a lower surface of the supplementary cover 46, and the other ends 37b and 38b of the second coil springs 37 and 38 forming the small diameter portions of the conductive elastic members 51 and 52 are disposed to be in contact with printed wirings 43 and 44 provided on the mother board 42 of the mobile phone, respectively (see FIG. 5). Consequently, the LED 30 is electrically connected to and held onto the mother board within the case of the mobile phone.

FIG. 5 illustrates a state in which the LED 30 is installed in the electric flash part 40.

The conductive elastic members 51 and 52 are in a compressed state between the bottom surface of each of the concave portions 31, 32 of the reflective frame 25 and the mother board 42, respectively. Consequently, through the elasticity of the conductive elastic members 51 and 52, the other ends of the second coil springs 37 and 38 which are the small diameter portions of the conductive elastic members 51 and 52 are compressed and electrically connected to the printed wirings 43 and 44 provided on the mother board 42, respectively.

Moreover, through the elasticity of the conductive elastic members 51 and 52, the LED 30 is held by the upper plate 45 and the mother board 42 to be installed in the case of the mobile phone.

As mentioned above, the LED 30 in this embodiment corresponds flexibly to a case design of the mobile phone in which the LED is installed and can be easily mounted on the designed case with a simple structure and at low cost. In addition, it is possible to accomplish standardization of size, in particular, reduction of thickness of the LED, and lower its cost.

Moreover, because the secure electrical connection of the LED 30 and the printed wirings 43 and 44 on the mother board 42 is established by the mechanical contact making use of the elasticity of the conductive elastic members 51 and 52, it is possible to eliminate a high-temperature reflow step in a mounting process to the mother board, prevent the translucent sealing resin 26 and the substrate 22 from separating, and obtain reliability and stability for a long period. Also, because heat resisting material is not required for structural parts of the LED, an inexpensive LED can be provided.

FIGS. 6 to 13 illustrate a second embodiment of the LED according to the present invention.

The LED in the second embodiment differs from that in the first embodiment in that the first coil springs as the large diameter portions of the conductive elastic members are formed separately from the second coil springs as the small diameter portions of the conductive elastic members.

The LED in the second embodiment is basically the same as that in the first embodiment. Accordingly, the same reference numbers as in the first embodiment are attached to identical parts in the second embodiment, and a description is omitted.

Figure 6:
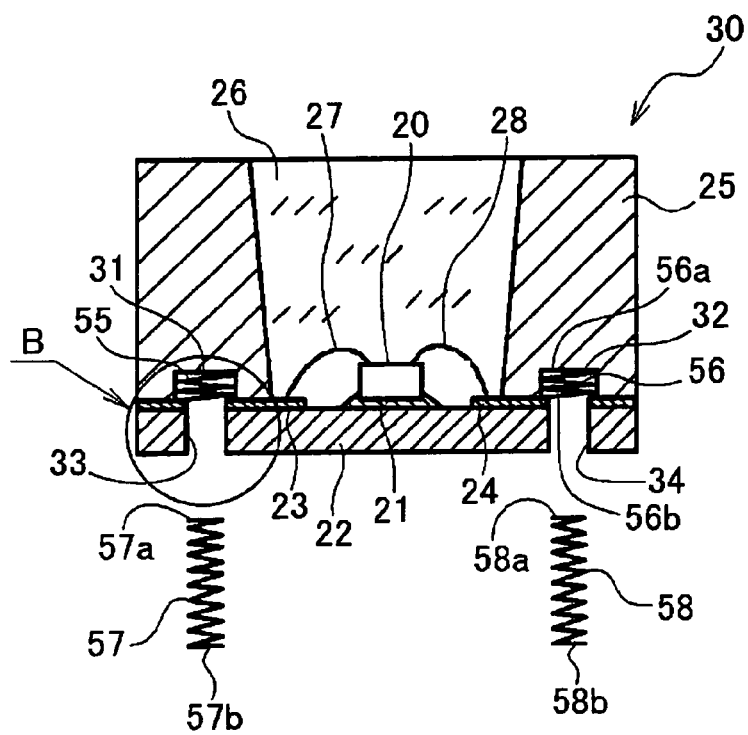
FIG. 6 is a schematic sectional view showing a second embodiment of the LED according to the present invention.
Figure 7:
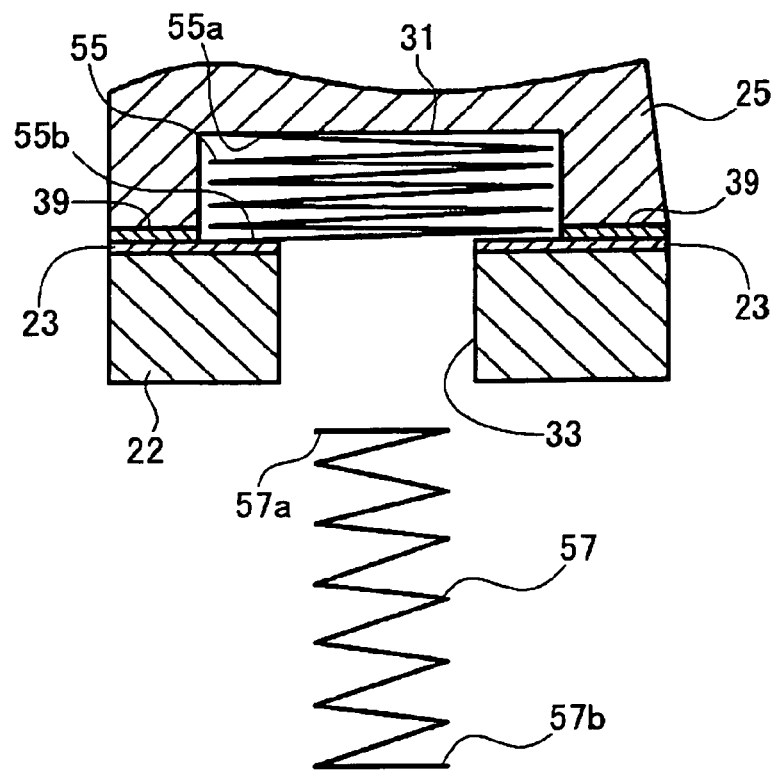
FIG. 7 is an enlarged sectional view of portion B in FIG. 6.

As shown in FIGS. 6 and 7, the LED 30 in this embodiment includes conductive elastic members having conductive first coil springs 55 and 56 forming large diameter portions and conductive second coil springs 57 and 58 forming small diameter portions. It should be noted that the first coil springs 55 and 56 and the second coil springs 57 and 58 are formed separately as independent members.

Each of the first coil springs 55 and 56 is disposed in a compressed state between the bottom surface of each of the concave portions 31 and 32 of the reflective frame 25 and each of the electrodes provided on the upper surface of the substrate 22.

The first coil springs 55 and 56 are previously installed in the LED 30.

The second coil springs 57 and 58 are inserted in the holes 33 and 34 of the substrate 22, respectively, when the LED is mounted on the mother board 42. Consequently, the first coil springs 55, 56 and second coil springs 57, 58 are electrically connected. In this way, each of the conductive elastic members in the second embodiment is configured to have a two-step spring structure in which the first coil spring having the large diameter portion and the second coil spring having the small diameter portion are separated.

As shown in FIG. 7, the first coil spring 55 is contained in the concave portion 31 of the reflective frame 25 and has one end 55a which is in contact with the bottom surface of the concave portion 31.

An outer diameter of the first coil spring 55 is preferably smaller than an inner diameter of the concave portion 31 of the reflective frame 25 to be set in the concave portion 31, and larger than the inner diameter of the hole 33 of the substrate 22 to secure electric connection. The first coil spring 55 has another end 55b which is disposed to be in contact with and electrically connected to the cathode electrode 23 of the substrate 22.

Figure 8:
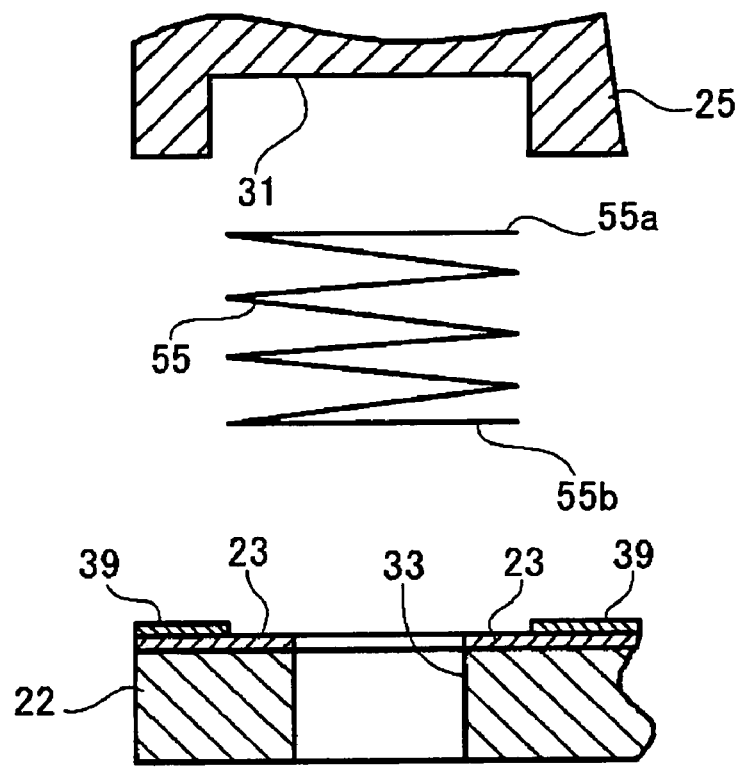
FIG. 8 is an exploded enlarged sectional view of the portion B in FIG. 6, disposing a large diameter portion of the conductive portion in a concave portion.

FIG. 8 illustrates an example of installation of the first coil spring 55 which is the large diameter portion.

The first coil spring 55 is first contained in the concave portion 31 of the reflective frame 25 and the one end 55a of the first coil spring 55 is disposed to be in contact with the bottom surface of the concave portion 31. Subsequently, the reflective frame 25 is pressed against the substrate 22 and the substrate 22 and the reflective frame 25 are fixed by the adhesive 39 in the state where the lower surface of the reflective frame 25 is in contact with the substrate 22. Thereby, as shown in FIG. 7, the first coil spring 55 is compressed, and the other end 55b thereof is in contact with and electrically connected to the cathode electrode 23.

The other first coil spring 56 is installed simultaneously with the first coil spring through the similar process to that in the above-mentioned first embodiment.

The first coil spring 56 is disposed in the concave portion 32 of the reflective frame 25, one end thereof is in contact with the bottom surface of the concave portion 32 and the other end thereof is in contact with the anode electrode 24 of the substrate 22 and electrically connected thereto.

An outer diameter of the first coil spring 56 is preferably smaller than the inner diameter of the concave portion 32 of the reflective frame 25 to be set in the concave portion 32, and larger than the inner diameter of the hole 34 of the substrate 22 to secure electric connection.

In this way, the first coil springs 55 and 56 are compressed when the substrate 22 and the reflective frame 25 are fixed by the adhesive 39, and the other ends 55b and 56b thereof are in contact with and electrically connected to the cathode and anode electrodes 23 and 24 of the substrate 22, respectively.

Figure 9:
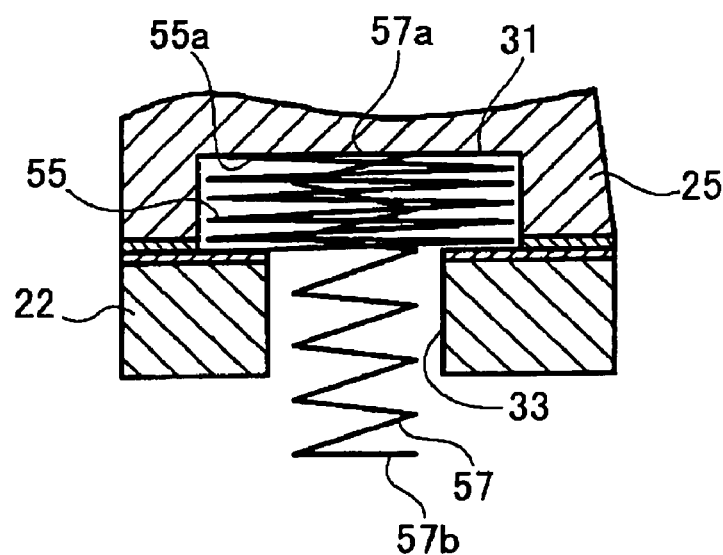
FIG. 9 is a partially enlarged sectional view showing the large diameter portion of the conductive elastic member disposed in the concave portion and the small diameter portion disposed in the hole according to the second embodiment of the present invention.

On the other hand, the second coil spring 57 has an outer diameter which is preferably smaller than the inner diameter of the hole 34 of the substrate 22 and an inner diameter of the first coil spring 55. The second coil spring 57 is inserted in the hole 33 of the substrate 22 and disposed inside the first coil spring 55 which is the large diameter portion, when the LED is mounted on the mother board. At this time, the second coil spring 57 which is the small diameter portion is in contact and electrically connected at one end 57a thereof with the one end portion 55a of the first coil spring 55 which is the large diameter portion and in contact with the bottom surface of the concave portion 31 of the reflective frame 25 through the one end portion 55a of the first coil spring 55, as shown in FIG. 9.

On the other hand, the other end portion 57b of the second coil spring 57 is disposed to project from the hole 33 of the substrate 22 to form a connecting terminal to an electronics device such as a mobile phone (not shown).

Figure 12A:
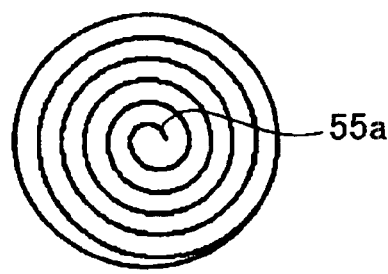
FIG. 12A is a plan view showing first coil spring used in each of the conductive elastic members according to the second embodiment of the present invention.
Figure 12B:
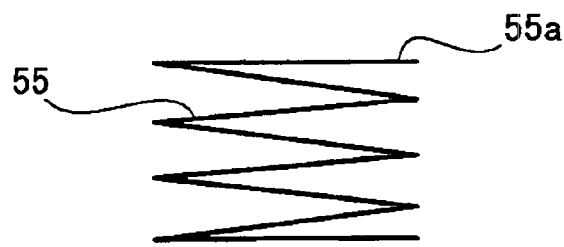
FIG. 12B is a side view showing the first coil spring used in each of the conductive elastic members according to the second embodiment of the present invention.
Figure 13A:
FIG. 13A is a plan view showing second coil spring used in each of the conductive elastic members according to the second embodiment of the present invention.
Figure 13B:
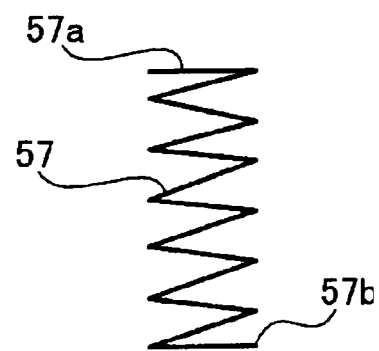
FIG. 13B is a side view showing the second coil spring used in each of the conductive elastic members according to the second embodiment of the present invention.

The one end portion 55a of the first coil spring 55 is preferably formed, for example, in a planar convoluted shape, as shown in FIG. 12A. This results in formation of a large contact surface with the one end portion 57a of the second coil spring 57 to secure the electrical connection. Furthermore, as shown in FIG. 13A, the one end portion 57a of the second coil spring 57 is also preferably formed in a planar convoluted shape to obtain a large contact surface.

Also, another second coil spring 58 is inserted in the hole 34 of the substrate 22, similarly to the one second coil spring 57. At this time, the second coil spring 57 is in contact and electrically connected at one end portion 58a thereof with the one end portion 56a of the first coil spring 56 which is the large diameter portion and in contact with the bottom surface of the concave portion 32 of the reflective frame 25 through the one end portion 56a of the first coil spring 56.

On the other hand, the other end portion 58b of the second coil spring 58 is disposed to project from the hole 33 of the substrate 22 to form a connecting terminal to an electronics device such as a mobile phone (not shown).

Although it is not shown, each of the ends of the other first coil spring 56 and the second coil spring 58 are also preferably formed in the similar convoluted shape to the first coil spring 55 and the second coil spring 57 to obtain a large contact surface.

Figure 10:
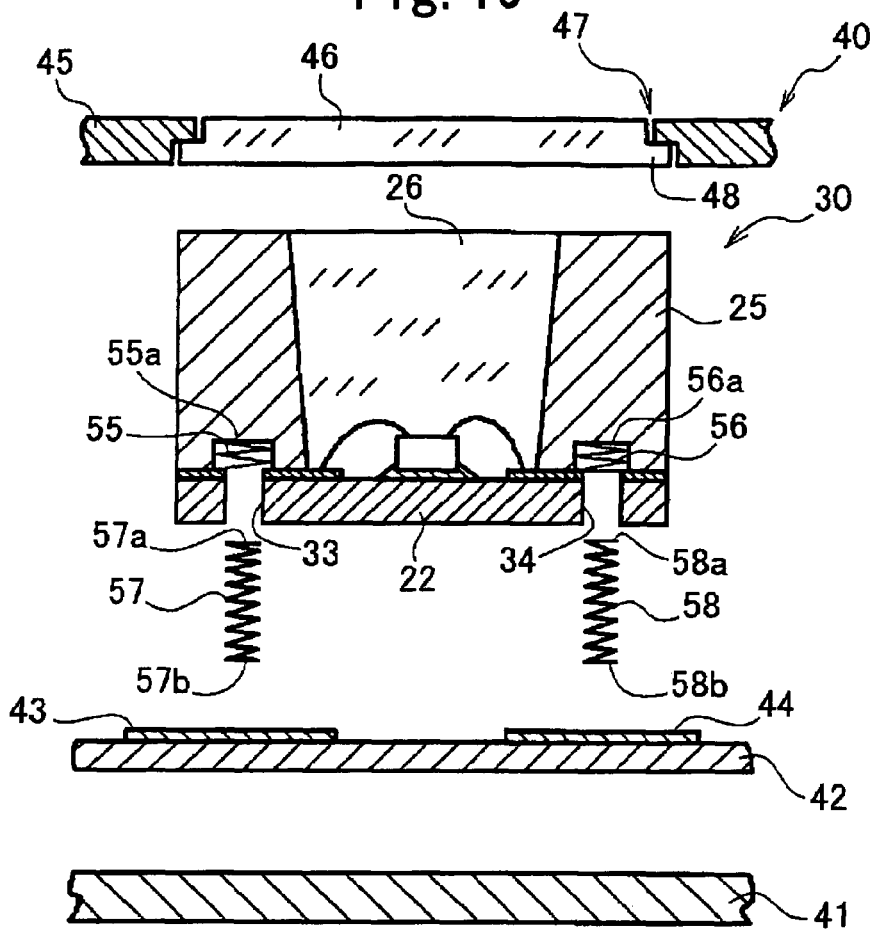
FIG. 10 is an exploded sectional view showing an example in which the LED in the second embodiment of the present invention is installed as a flash electric device in a mobile device including functions of camera and movie.
Figure 11:
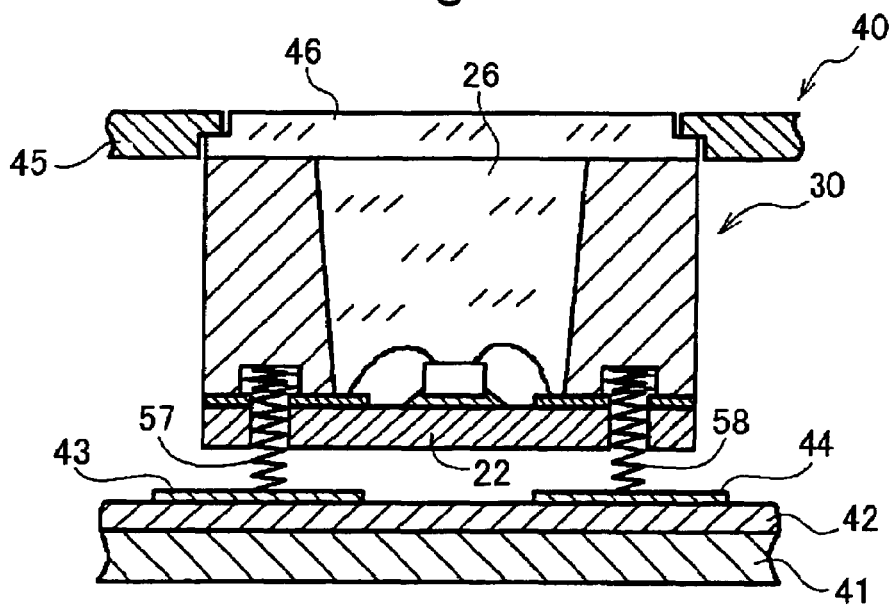
FIG. 11 is a sectional view showing an example in which the LED in the second embodiment is installed in the mobile device.

FIGS. 10 and 11 illustrate an example in which the LED 30 in the second embodiment is installed as an electric flash light source of an electric flash part 40 of a mobile phone with functions of camera and movie.

Similarly to the above-mentioned embodiment, the electric flash part 40 of the mobile phone has the supplementary cover 46 whose outer peripheral portion is fitted in the concave portion 47 provided in the upper plate 45.

More specifically, the flange 48 is provided on the outer peripheral portion of the supplementary cover 46. The supplementary cover 46 is fixed to the upper plate 45 in the state in which the upper surface of the supplementary cover 46 is exposed by engaging its flange 48 with the edge of the concave portion 47.

On the other hand, in the LED 30 which is installed as the electric flash light source, the upper surface of the reflective frame 25 which is the light emission side is in contact with the supplementary cover 46 which is fixed to the upper plate 45. Next, the second coil springs 57 and 58 are inserted in the holes 33 and 34 of the substrate 22, the ends 57a and 58a of the second coil springs 57 and 58 are disposed to be in contact with and electrically connected to the end portions 55a and 56a of the first coil springs 55 and 56, respectively. At this time, the other end portions 57b and 58b of the second coil springs 57 and 58 are disposed to project from the holes 33 and 34 to form contact terminals with the printed wirings 43 and 44.

Next, the other end portions 57b and 58b of the second coil springs 57 and 58 make contact with printed wirings 43 and 44 provided on the mother board 42, respectively, and by making the lower surface of the mother board 42 come in contact with the lower plate 41 in this state, the LED 30 is installed in the electric flash part 40.

Consequently, as shown in FIG. 11, each of the second coil springs 57 and 58 is compressed between the bottom surface of each of the concave portions 31 and 32 of the reflective frame 25 and the mother board 42, and, through elasticity of the second coil springs 57 and 58, the end portions 57a and 58a of the second coil springs 57 and 58 are in contact with and electrically connected to the end portions 55a and 56a of the first coil springs 55 and 56, and the other end portions 57b and 58b of the second coil springs 57 and 58 are pressed and electrically connected to the printed wirings 43 and 44 on the mother board 42, respectively.

Moreover, through elasticity of the second coil springs 57 and 58, the LED 30 is held by the upper and lower plates 45 and 41 through the mother board 42 to be installed in the case of the mobile phone.

As mentioned above, in the LED in this embodiment, each of the first coil springs 55 and 56 which are the large diameter portions of the conductive elastic members and each of the second coil springs 57 and 58 which are the small diameter portions of the conductive elastic members are separately formed as independent members. The first coil springs 55 and 56 only are previously installed in the LED 30. After installation and when the LED 30 is mounted on the mother board, the second coil springs 57 and 58 which are the small diameter portions can be inserted in the holes 33 and 34 of the substrate 22. Consequently, a length of each of the second coil springs 57 and 58 can be freely set in accordance with the design, in particular, the thickness, of the case, allowing flexible correspondence to the case design.

Because each of the first coil springs 55 and 56 which are the large diameter portions and each of the second coil springs 57 and 58 which are the small diameter portions are separately formed, it is possible to further stabilize the electrical connection at contact points thereof and achieve high reliability.

In addition, even in this embodiment, the same effects as in the first embodiment can be acquired.

FIGS. 14 to 18 illustrate a third embodiment of the LED according to the present invention.

The LED in this embodiment is the same as that in the first embodiment in that first and second coil springs having large and small diameter portions as conductive elastic members are integrally formed, but differs in that an end portion of each small diameter portion is disposed in the corresponding large diameter portion and end portions of the large and small diameter portions are mechanically, electrically and integrally connected. In other respects the structure is the same as in the first embodiment. Accordingly, the same reference numbers as in the first embodiment are attached to identical parts, and a description is omitted.

Figure 14:
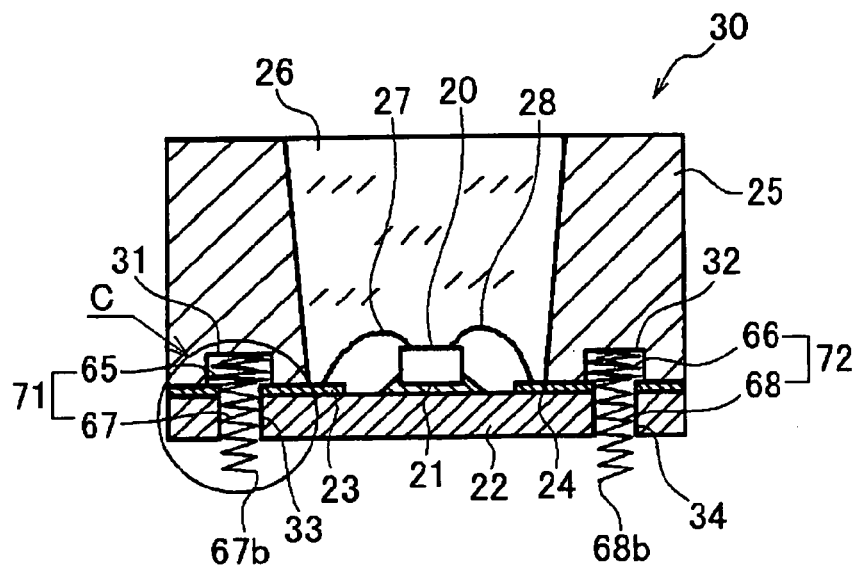
FIG. 14 is a schematic sectional view showing a third embodiment of the LED according to the present invention.

As shown in FIG. 14, each of the conductive elastic members 71 and 72 in the third embodiment includes conductive first coil springs 65 and 66 forming large diameter portions and conductive second coil springs 67 and 68 forming small diameter portions.

Figure 15:
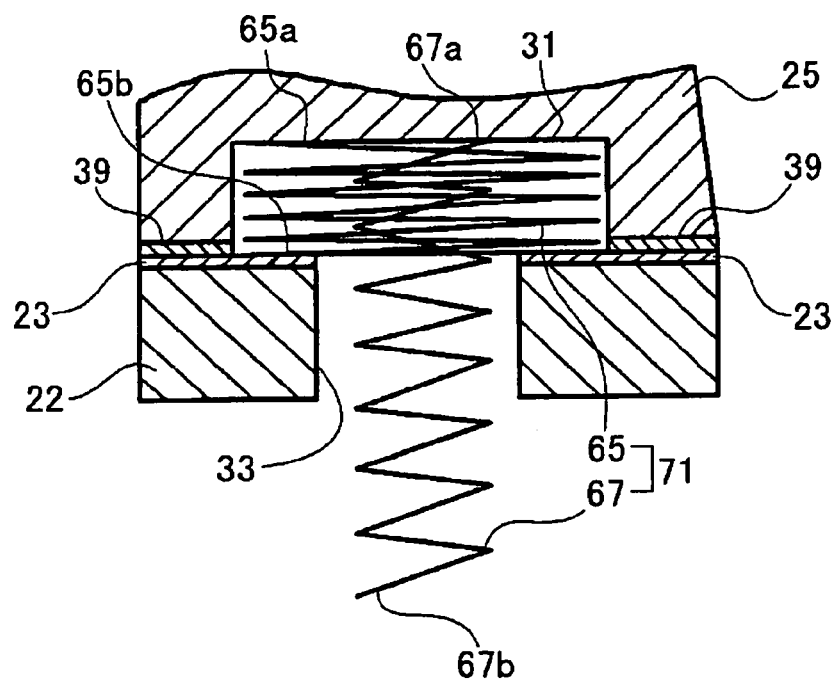
FIG. 15 is an enlarged sectional view of portion C in FIG. 14.

The first coil spring 65 constituting the conductive elastic member 71 is disposed in the concave portion 31 of the reflective frame 25, as shown in FIGS. 14 and 15. The first coil spring 65 has one end portion 65a which is in contact with a bottom surface of the concave portion 31.

An outer diameter of the first coil spring 65 is preferably set to be smaller than the inner diameter of the concave portion 31 of the reflective frame 25 and larger than the inner diameter of the hole 33 of the substrate 22. The first coil spring 65 has another end 65b which is in contact with the cathode electrode 23 of the substrate 22 and electrically connected thereto.

On the other hand, the second coil spring 67 has one end portion 67a which is disposed inside the first coil spring 65 (see FIGS. 15 and 16), and the one end 67a is integrally connected with and electrically connected to the one end 65a of the first coil spring 65. Thereby, the one end 67a of the second coil spring 67 is in contact with the bottom surface of the concave portion 31 of the reflective frame 25 together with the one end 65a of the first coil spring 65.

An outer diameter of the second coil spring 67 is set to be smaller than the outer diameter of the first coil spring 65 and the inner diameter of the hole 33 of the substrate 22. The second coil spring 67 is also inserted in the hole 33 of the substrate 22 and has the other end 67b which is disposed to project from the hole 33 of the substrate 22 to form a connecting terminal to connect to an exterior electronics device such as a mobile phone (not shown).

In this way, the conductive elastic member 71 in which the first and second coil springs 65 and 67 are integrally formed is configured to form a two-step spring structure having stability of mechanical expansion and contraction.

Figure 16:
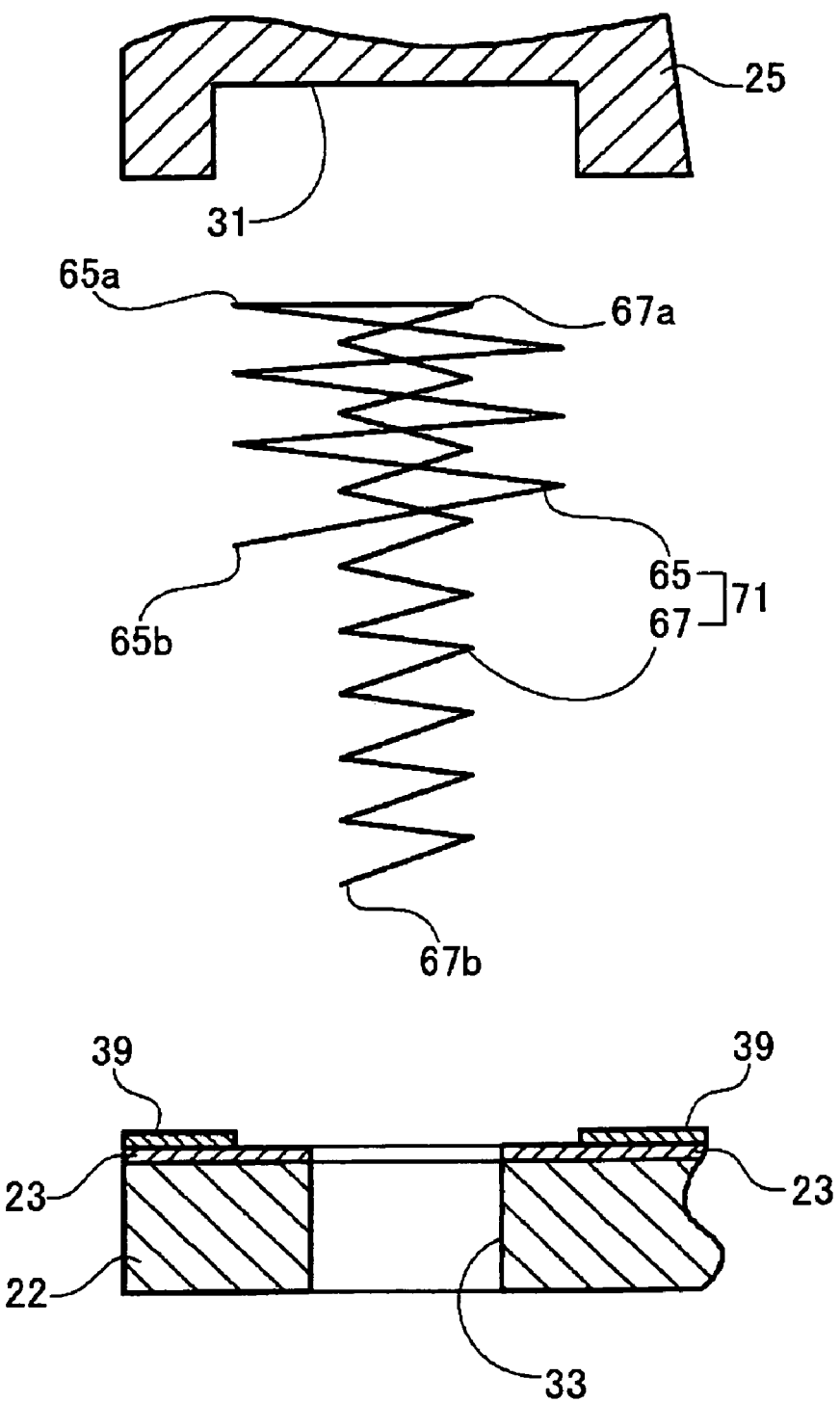
FIG. 16 is an exploded enlarged sectional view of the portion C in FIG. 14.

In order to set the above-mentioned conductive elastic member 71, as shown in FIG. 16, the second coil spring 67 which is the small diameter portion of the conductive elastic member 71 is inserted in the hole 33 of the substrate 22 from an upper surface where the cathode electrode 23 is disposed, and the other end 65b of the first coil spring 65 which is the large diameter portion is disposed to be in contact with the cathode electrode 23. At this time, the other end portion 67b of the second coil spring 67 is projected from the hole 33 to form the connecting terminal to the exterior device.

Next, the first coil spring 65 which is the large diameter portion is contained in the concave portion 31 of the reflective frame 25, and the one end 65a of the first coil spring 65 is disposed to be in contact with the bottom surface of the concave portion 31. At this time, the one end portion 67a of the second coil spring 67 is also in contact with the bottom surface of the concave portion 31.

Subsequently, the reflective frame 25 is pressed down toward the substrate 22. When the reflective frame 25 comes into contact with the substrate 22, they are fixed by an adhesive 39. Consequently, as shown in FIG. 15, the first coil spring 65 is compressed, and the other end 65b thereof is in contact with and electrically connected to the cathode electrode 23 disposed on the upper surface of the substrate 22.

Because the other conductive elastic member 72 is the same in structure as the above-mentioned conductive elastic member 71, a simple description is made as follows.

The first coil spring 66 constituting the conductive elastic member 72 is disposed in the concave portion 32 of the reflective frame 25, through the similar process to the first coil spring 65. The first coil spring 66 has one end portion which is in contact with the bottom surface of the concave portion 32 and other end portion which is in contact with the anode electrode 24 disposed on the upper surface of the substrate 22 and electrically connected thereto.

Moreover, the second coil spring 68 has one end portion 68a, a portion of which is disposed inside the first coil spring 66, similarly to the second coil spring 67. The one end portion of the second coil spring 68 is integrally connected to the one end portion of the first coil spring 66 so that the first and second coil springs 66 and 68 are mechanically and electrically connected. Thereby, the one end portion of the second coil spring 68 is in contact with the bottom surface of the concave portion 31 of the reflective frame 25 together with the one end portion of the first coil spring 66.

The second coil spring 68 is inserted in the hole 33 of the substrate 22 and has another end portion 68b which is disposed to project from the hole 33 at the lower surface of the substrate 22 to form a connecting terminal to connect to an exterior electronics device such as a mobile phone (not shown).

In this way, the first and second coil springs 66 and 68 are integrally connected to form the conductive elastic member 72.

In addition, the conductive elastic member 72 is installed simultaneously with the conductive elastic member 71, through the similar process to the conductive elastic member 71. In this case, the first coil spring 66 is compressed and the other end portion of the first coil spring 66 comes into contact with and is electrically connected to the anode electrode 24 disposed on the upper surface of the substrate 22. Because further description in this regard is similar to that for the conductive elastic member 71, the description is omitted.

As mentioned above, the conductive elastic members 71 and 72 installed in the LED 30 in this embodiment are formed from the conductive first coil springs 65 and 66 forming the large diameter portions and the conductive second coil springs 67 and 68 forming the small diameter portions. The first and second coil springs 65, 66 and 67, 68 are integrally formed, respectively and form the two-step spring structures in which the first and second coil springs 65, 66 and 67, 68 are mechanically and electrically connected.

The conductive first coil springs 65 and 66 forming the large diameter portions are disposed in a compressed state between the bottom surface of each of the concave portions 31 and 32 and the electrodes disposed on the upper surface of the substrate 22. At this time, the one end portion of each of the second coil springs 67 and 68 is in contact with the bottom surface of each of the concave portions 31 and 32 of the reflective frame 25 together with the one end portion of each of the first coil springs 65 and 66. In addition, the one end portion of each of the conductive second coil springs 67 and 68 forming the small diameter portions is inserted in each of the holes 33 and 34 of the substrate 22 and the other end portions 67b and 68b thereof are disposed to project from the holes 33 and 34 of the substrate 22.

An example in which the LED 30 is provided as an electric flash light source of an electric flash part 40 of a mobile phone with functions of camera and movie is similar to the first embodiment. Therefore, a description with respect to the same structural parts is omitted, and an example in which the LED is mounted on the mother board according to this embodiment is described simply as follows.

Figure 17:
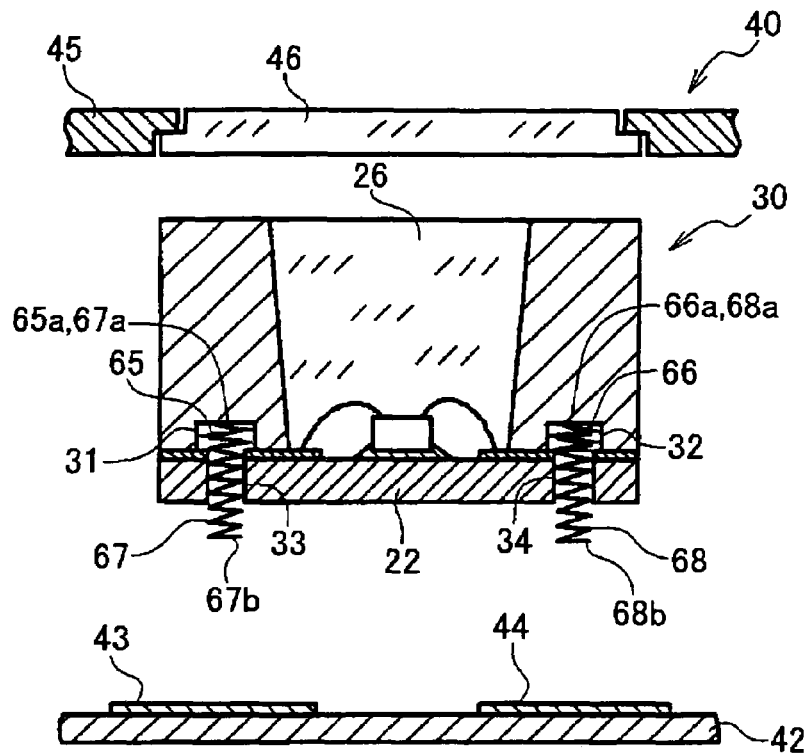
FIG. 17 is an exploded sectional view showing an example in which the LED in the third embodiment of the present invention is installed as a flash electric device in a mobile device including functions of camera and movie.

In the LED 30, as shown in FIG. 17, the upper surface of the reflective frame 25 which is the emission side of light is in contact with the supplementary cover 46 fixed to the upper plate 45 and the lower surface of the reflective frame 25 is attached to the upper surface of the substrate. The other end portions 67b and 68b of the second coil springs 67 and 68 which project from the lower surface of the substrate are in contact with the printed wirings 43 and 44 on the mother board 42, respectively, and the lower surface of the mother board 42 is held in the case belonging to an exterior electronics device such as a mobile phone.

Figure 18:
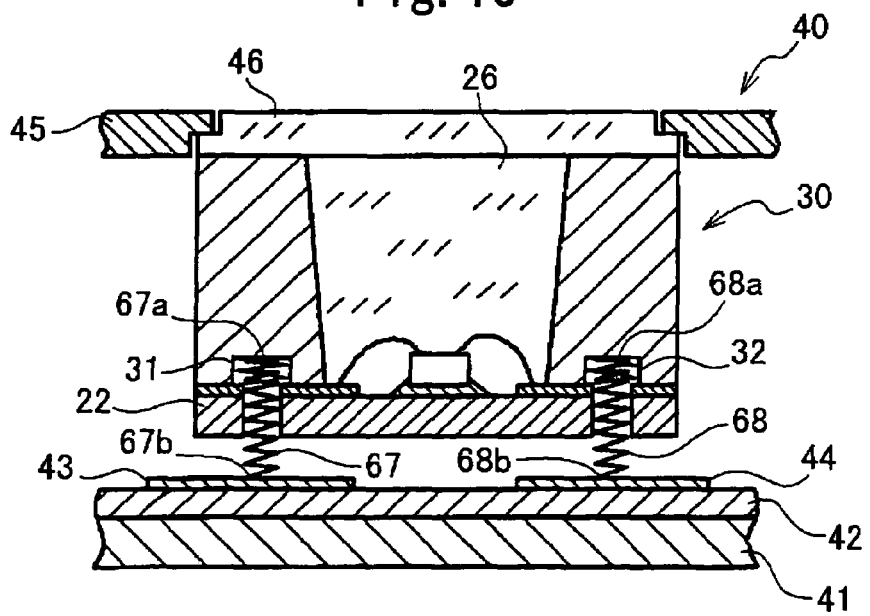
FIG. 18 is a sectional view showing an example in which the LED in the first embodiment of the present invention is installed as the flash electric device in the mobile device including functions of camera and movie.
Figure 19:
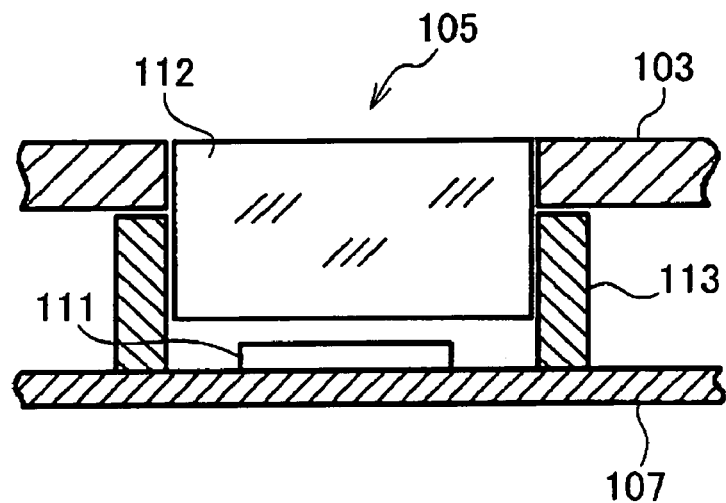
FIG. 19 is a schematic sectional view showing flash electric device using a conventional white LED and disposed in a case mobile phone with a camera.
Figure 20:
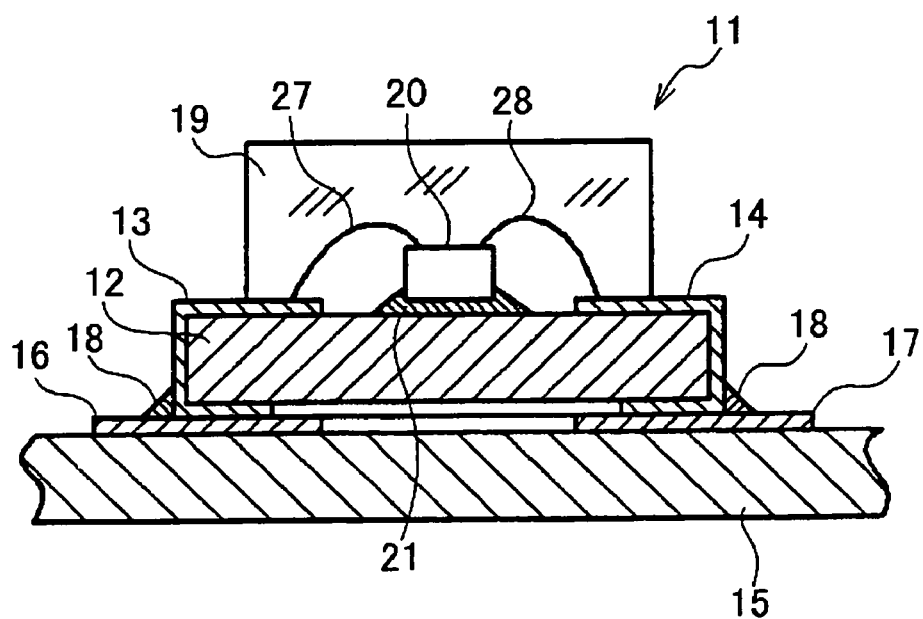
FIG. 20 is a schematic sectional view showing a conventional white LED.

Consequently, as shown in FIG. 18, each of the second coil springs 67 and 68 which are the small diameter portions of the conductive elastic members is in a compressed state between the bottom surface of each of the concave portions 31 and 32 of the reflective frame 25 and the mother board 42.

Through elasticity of the second coil springs 67 and 68 which are the small diameter portions, the other end portions 67b and 68b of the second coil springs 67 and 68 are pressed and electrically connected to the printed wirings 43 and 44 on the mother board 42, respectively.

Moreover, through the elasticity of the second coil springs 67 and 68, the LED 30 is held by the upper plate 45 and the mother board 42 to be fixed in the case of the mobile phone with functions of camera and movie.

As mentioned above, in the LED 30 in the third embodiment, the first coil springs 65 and 66 which are the large diameter portions of the conductive elastic members 71 and 72 and the second coil springs 67 and 68 which are the small diameter portions of the conductive elastic members are integrally formed. In this case, each of the first coil springs 65 and 66 which are the large diameter portions is disposed in the compressed state between the bottom surface of each of the concave portions 31 and 32 of the reflective frame 25 and the upper surface of the substrate 22. Moreover, each of the second coil springs 67 and 68 is compressed between the bottom surface of each of the concave portions 31 and 32 of the reflective frame 25 and the mother board 42.

In this way, because the first coil springs 65 and 66 which are the large diameter portions and the second coil springs 67 and 68 which are the small diameter portions are configured to operate as independent elastic members, interference thereof does not occur. Therefore, the first coil springs 65 and 66 and the second coil springs 67 and 68 have stable electrical connection at the connections thereof and high reliability.

The LED 30 in the third embodiment has the same advantageous results as in the first embodiment.

Although the preferred embodiments of the present invention have been mentioned, the present invention is not limited to these embodiments, and various modifications and changes can be made to the embodiments.

That is to say, the conductive elastic members of the present invention has been applied to the LED which is mentioned as an electric flash light source in the above-mentioned embodiments, but the conductive elastic members according to the present invention is applicable to other surface mount type LEDs.

Also, in the above-mentioned embodiments, although the conductive elastic members are embodied as coil springs, plate springs may be used instead of the coil springs.

What is claimed is:

1. A light emitting diode including a substrate having a pair of terminal electrodes, at least one light emitting diode element mounted on the substrate, and a frame disposed on the substrate around the at least one light emitting diode element, the light emitting diode comprising:
a pair of holes, each of the holes disposed adjacent to each of the pair of terminal electrodes and penetrating the substrate, respectively;
a pair of concave portions, each of the concave portions provided in a position of the frame facing each of the holes; and
a pair of conductive elastic members, each of the members provided between the frame and the substrate, respectively;
wherein each of the conductive elastic members includes a large diameter portion inserted in each of the concave portions of the frame and a small diameter portion which is inserted in each of the holes of the substrate and electrically connected to the large diameter portion,
wherein each of the large diameter portions is electrically connected to each of the terminal electrodes of the substrate, and
wherein each of the large diameter portions has one end portion which is in contact with a bottom surface of the concave portion and each of the small diameter portions has one end which is disposed to project from each of the holes in the substrate.

2. An electronics device comprising:
the light emitting diode according to claim 1;
a mother board on which the light emitting diode is mounted; and
a case containing the light emitting diode,
wherein the small diameter portions of the conductive elastic members are pressed onto printed wirings on the mother board to be electrically connected, respectively, and
wherein the light emitting diode is held in the case.

3. The light emitting diode according to claim 1,
wherein each of the large diameter portions of the conductive elastic members is held in a compressed state between the substrate and the frame.

4. The light emitting diode according to claim 1,
wherein an outer diameter of each of the large diameter portions is set to be larger than an inner diameter of each of the holes provided in the substrate, and smaller than an inner diameter of each of the concave portions provided in the frame.

5. The light emitting diode according to claim 1,
wherein the one end portion of each of the large diameter portions is in contact with the bottom surface of the concave portion of the frame and the other end portion of each of the large diameter portions is in contact with each of the terminal electrodes disposed on the substrate to be electrically connected, and
wherein one portion of each of the small diameter portions is disposed inside each large diameter portion, one end of each small diameter portion is electrically connected to the one end portion of each large diameter portion, and the other end portion of each small diameter portion is disposed to project from each hole of the substrate.

6. The light emitting diode according to claim 1,
wherein the large diameter portion and the small diameter portion of each of the conductive elastic members are separately formed,
wherein the one end portion of each of the large diameter portions is in contact with the bottom surface of the concave portion of the frame and the other end portion of each of the large diameter portions is in contact with each of the terminal electrodes of the substrate to be electrically connected, and
wherein one end portion of each of the small diameter portions is electrically connected to the one end portion of the large diameter portion to be electrically connected, and the other end portion of each small diameter portion is disposed to project from each hole of the substrate.

7. The light emitting diode according to claim 1,
wherein the conductive elastic members comprise conductive coil springs or conductive plate springs.

8. The light emitting diode according to claim 1,
wherein an inner diameter of each of the holes provided in the substrate is set to be smaller than that of each of the concave portions provided in the frame.

9. The light emitting diode according to claim 1, wherein the frame and the substrate are fixed by an adhesive or adhesive sheet.

10. The light emitting diode according to claim 1, wherein the frame comprises a reflective frame to reflect light emitted from the light emitting diode element.

11. The light emitting diode according to claim 1, wherein the large diameter portion and the small diameter portion in each of the pair of conductive elastic members are integrally formed.

12. The light emitting diode according to claim 1, wherein the large diameter portion and the small diameter portion in each of the pair of conductive elastic members are independently formed.

13. The light emitting diode according to claim 12, wherein the small diameter portion has one end portion which is inserted in and electrically connected to the large diameter portion.

\* \* \* \* \*